(12) United States Patent
Havemann

(10) Patent No.: US 6,188,125 B1
(45) Date of Patent: Feb. 13, 2001

(54) VIA FORMATION IN POLYMERIC MATERIALS

(75) Inventor: Robert H. Havemann, Garland, TX (US)

(73) Assignee: Texas Instruments Incorporated, Dallas, TX (US)

(*) Notice: Under 35 U.S.C. 154(b), the term of this patent shall be extended for 0 days.

(21) Appl. No.: 08/476,293

(22) Filed: Jun. 7, 1995

Related U.S. Application Data

(62) Division of application No. 08/234,099, filed on Apr. 28, 1994, now abandoned.

(51) Int. Cl.⁷ .................................................. H01L 23/532
(52) U.S. Cl. ......................... 257/640; 257/642; 257/759; 438/623
(58) Field of Search ................................... 257/759, 640, 257/642, 643

(56) References Cited

U.S. PATENT DOCUMENTS

| | | | |
|---|---|---|---|
| 4,523,372 | * 6/1985 | Balda et al. | 257/643 |
| 5,103,288 | 4/1992 | Sakamoto et al. | 257/758 |
| 5,155,576 | 10/1992 | Mizushima | 257/759 |
| 5,284,801 | 2/1994 | Page et al. | 437/195 |

FOREIGN PATENT DOCUMENTS

| | | | |
|---|---|---|---|
| 0 177 845 | * 4/1986 | (EP) | 257/759 |
| 3-27551 | * 2/1991 | (JP) | 257/759 |
| 6097299 | 11/1992 | (JP) . | |

OTHER PUBLICATIONS

IBM Technical Disclosure Bulletin, "Lithographic Patterns with a Barrier Liner," vol. 32, No. 10 B Mar. 1990, pp. 114–115.*

Thin Solid Films, Sep. 25, 1993, Switzerland, vol. 232, No. 2, ISSN 0040–6090, pp. 256–260, Kubono A. Et al., Direct Formation of Polymide Thin Films by Vapor Deposition Polymerization.

08/234,100 Havemann filed Apr. 28, 1994.

* cited by examiner

*Primary Examiner*—Olik Chaudhuri
*Assistant Examiner*—Theresa T. Doan
(74) *Attorney, Agent, or Firm*—Wade James Brady, III; Frederick J. Telecky, Jr.

(57) ABSTRACT

A semiconductor device and process for making the same are disclosed which use organic-containing materials to reduce capacitance between conductors, while allowing conventional photolithography and metal techniques and materials to be used in fabrication. In one structure, patterned conductors 18 are provided on an interlayer dielectric 10, with an inorganic substrate encapsulation layer 32 deposited conformally over this structure. A layer of an organic-containing dielectric material 22 (pure parylene, for example) is then deposited to substantially fill the gaps between and also cover the conductors. An inorganic cap layer 24 of a material such as $SiO_2$ is deposited, followed by a photolithography step to define via locations. Vias are etched through the cap layer, and then through the organic-containing dielectric (this step may also be used to strip the photoresist). An inorganic via passivating layer 30 is conformally deposited and then anisotropically etched to clear the bottom of the vias while leaving a passivating liner in the via, preventing the via metal from contacting organic-containing material. A second application of these steps forms a second, overlying structure of patterned conductors 38, inorganic encapsulating layer 36, organic-containing dielectric layer 40, and inorganic cap layer 42.

8 Claims, 3 Drawing Sheets

US 6,188,125 B1

VIA FORMATION IN POLYMERIC MATERIALS

This is division of application Ser. No. 08/234,099, filed Apr. 28, 1994, now abandoned.

FIELD OF THE INVENTION

This invention relates generally to the fabrication of semiconductor devices, and more particularly to methods and structures for using organic-containing materials as intra/interlevel dielectrics.

BACKGROUND OF THE INVENTION

Semiconductors are widely used in integrated circuits for electronic devices such as computers and televisions. These integrated circuits typically combine many transistors on a single crystal silicon chip to perform complex functions and store data. The need to integrate more functions and more storage capacity onto a chip has caused the semiconductor industry to search for ways to shrink, or scale, the size of individual transistors and other devices commonly integrated on a chip. However, scaling devices to smaller dimensions can create a multitude of undesirable effects. One of these effects is an increase in the capacitive coupling between conductors in a circuit, since the capacitive coupling is inversely proportional to the distance between the conductors. This coupling may limit the ultimate speed of the device or otherwise inhibit proper device operation, if steps are not taken to reduce the coupling.

The capacitance between conductors is also highly dependent on the insulator, or dielectric, used to separate them. Conventional semiconductor fabrication commonly employs silicon dioxide as a dielectric, which has a dielectric constant of about 3.9. Many alternate materials have been used or suggested as a way of providing a lower dielectric constant. One such group of materials is organic polymer-containing dielectrics.

SUMMARY OF THE INVENTION

Organic-containing dielectric materials possess many desirable qualities, but it is herein recognized that they are plagued by problems which make their use difficult. One of the problems related to the use of organic-containing dielectrics is that they are generally removed by the same etching procedures commonly used to remove photoresist (a temporary material which is deposited on semiconductor devices to create patterns for various device layers). Other problems with organic-containing materials are the difficulty in adhering contact metal to them, and the possibility of organic-containing materials out-gassing during deposition of adjoining contact metal and reacting with the metal.

The present invention provides a method and structure for creating organic-containing dielectric layers which contain vias on a semiconductor device, allowing electrical connections between conductors above and below the dielectric layer. The present invention uses a novel combination of processing steps to create lined vias through organic-containing dielectrics, thereby both enhancing compatibility with metal processing and preventing damage to the organic-containing dielectrics by subsequent photolithography steps. The organic-containing dielectrics are also desirable because of their relatively low dielectric constant, compared to silicon dioxide dielectrics.

The present invention provides a method for fabricating dielectrics for semiconductor devices with reduced dielectric constant, compared to conventional oxide fabrication techniques, while maintaining compatibility with common semiconductor metal deposition and photlithography materials and techniques. The method can comprise forming a layer of patterned conductors on a substrate, where the substrate may be an actual semiconductor substrate or a previous interlayer dielectric, covering the patterned conductors and substrate with a layer of organic-containing material, and depositing an inorganic cap layer of a material such as $SiO_2$ over the organic-containing layer. The method can further comprise etching of vias through the cap layer and the organic-containing layer, depositing an inorganic conformal passivating layer over all exposed surfaces, and removing the passivating layer from horizontal surfaces, including the top surface of the cap layer and the bottoms of the vias. This creates a passivating liner which can provide physical isolation for the organic-containing dielectric during subsequent metal deposition or photoresist strip processing steps. One possible variation of the method can provide a total encapsulation of the organic-containing material by an inorganic material such as oxide, preventing contact between the organic-containing dielectric and the underlying conductors also.

Preferably, the organic-containing material is an organic polymer, such as parylene or a polyimide. The organic-containing material may also be a polymer-containing oxide which can be applied as an SOG (spin-on glass), such as the Allied Signal 500 series. The cap layer and passivating layer(s) are preferably composed of inorganic materials such as silicon nitride or compounds containing at least 95% silicon dioxide by weight.

A semiconductor device according to the present invention can comprise a layer of patterned conductors formed on a substrate, where the substrate can be an actual semiconductor substrate or a previously deposited interlayer dielectric, with an organic-containing dielectric layer substantially filling the spaces between and covering the conductors to a depth at least 50% of their height. The device can further comprise a cap layer composed of inorganic material deposited over the organic-containing layer, and at least one via etched through the cap layer and organic-containing layer for the purpose of allowing contacts to be made to the conductors. The device can further comprise a passivating layer deposited on the exposed portions of the organic-containing layer in the vias, and conducting material deposited in the vias so as to provide electrical connections to the patterned conductors.

BRIEF DESCRIPTION OF THE DRAWINGS

This invention, including the features and advantages thereof, can be best understood by reference to the following drawings, wherein.

DETAILED DESCRIPTION OF THE PREFERRED EMBODIMENTS

Figure 1A:
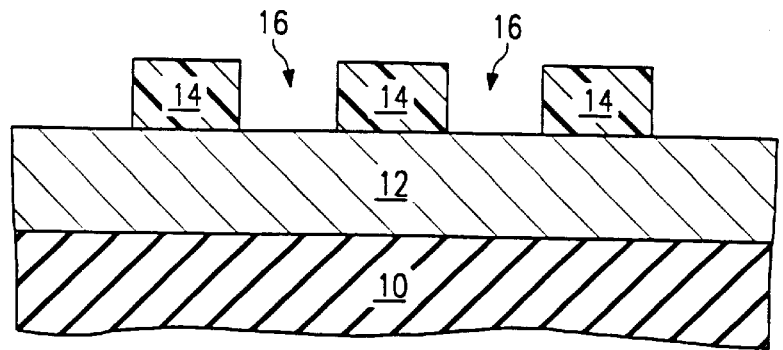
FIGS. 1A–1E are cross-sectional views showing the progressive steps in the fabrication of a layer of patterned conductors, an organic-containing dielectric layer with an overlying cap layer, a via through the cap layer and organic-containing dielectric layer, and the creation of via sidewalls.
Figure 1B:
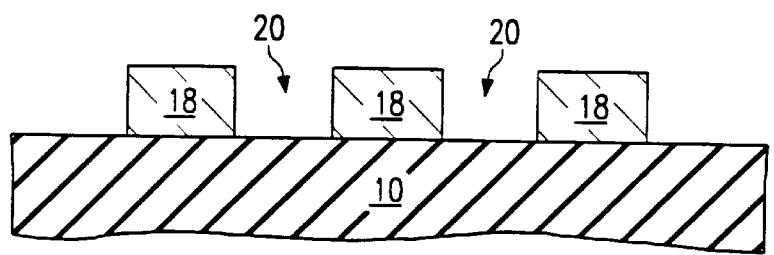
Figure 1C:
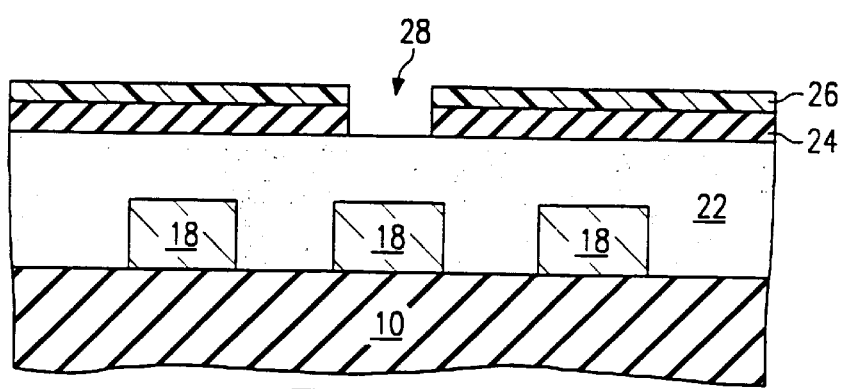
Figure 1D:
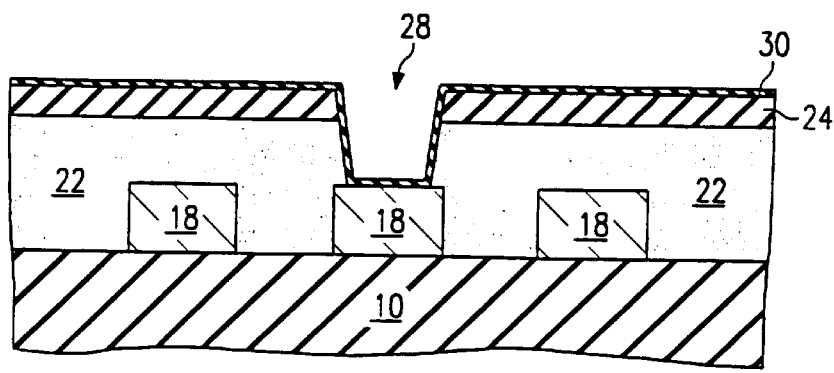
Figure 1E:
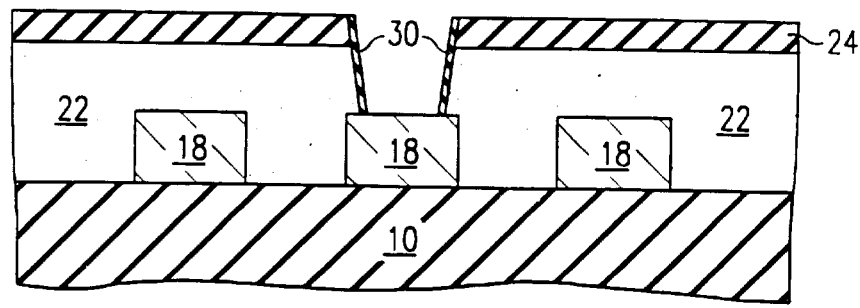

In one embodiment, this invention provides a method for fabricating organic-containing dielectric layers with a capping passivation layer and passivation liners in vias passing through the organic-containing dielectric layer. The method of this embodiment is illustrated in FIG. 1. With reference to FIG. 1A, a conducting layer 12 is deposited on an insulating layer 10. Conducting layer 12 may be connected through insulating layer 10 to an underlying structure (not shown). A layer of photoresist 14 is spun on over conducting layer 12, exposed through a mask pattern and developed, such that the photoresist layer 14 contains gaps 16 where conducting layer 12 is to be removed. Referring now to FIG. 1B, conducting material has been removed using an etching process which removes material below gaps in the photoresist layer to create patterned conductors 18 separated by gaps 20. The photoresist 14 of FIG. 1A has also been stripped and does not appear in FIG. 1B. FIG. 1C shows additional layers added to the structure. An organic-containing dielectric layer 22 fills the gaps 20 of FIG. 1B, as well as covering patterned conductors 18 to a thickness roughly equivalent to the thickness of the conductors themselves (layer 22 generally having a depth measured in gap 20 of at least 150% of conductor thickness and shown as 200% of conductor thickness). This organic-containing layer may, for example, be made out of an organic polymer such as parylene, which may be deposited using a vapor-phase polymerization method. An inorganic cap layer 24, made of silicon dioxide for instance, is deposited over the organic-containing dielectric layer 22 (this layer may optionally be planarized, e.g. using a chemical-mechanical polisher), and a new layer of photoresist 26 is then deposited over the inorganic cap layer 24. A via 28 is show after mask patterning and developing of photoresist layer 26, and after anisotropic etch of inorganic cap layer 24. An anisotropic etch of via 28 through dielectric layer 22 may also serve to strip photoresist 26 from the device, if both are affected by the same etching procedure. FIG. 1D illustrates the device after via 28 has been etched through dielectric layer 22 to conductor 18. This figure also shows an inorganic via passivation layer 30 applied conformally over the exposed surfaces of the device. Preferably, via passivation layer 30 is constructed of a material similar to inorganic layer 24, although this is not required. Finally, FIG. 1E shows the via passivation layer 30 remaining only on the via sidewalls, after an anisotropic etch has been used to remove passivation material from the bottom of the via and from the top of the hard mask. This configuration is desirable because it provides decreased capacitive coupling, while maintaining inorganic surface materials such as oxides and nitrides for subsequent via metallization, photolithography, and other steps.

Figure 2A:
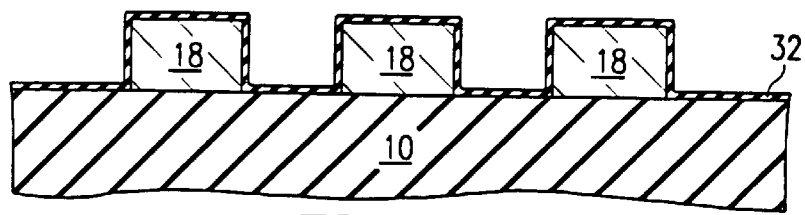
FIGS. 2A–2C are cross-sectional views of a second embodiment containing a metal/substrate encapsulation layer over the patterned conductors and employing a portion of the cap layer as a sacrificial layer to clear the bottom of the via.
Figure 2B:
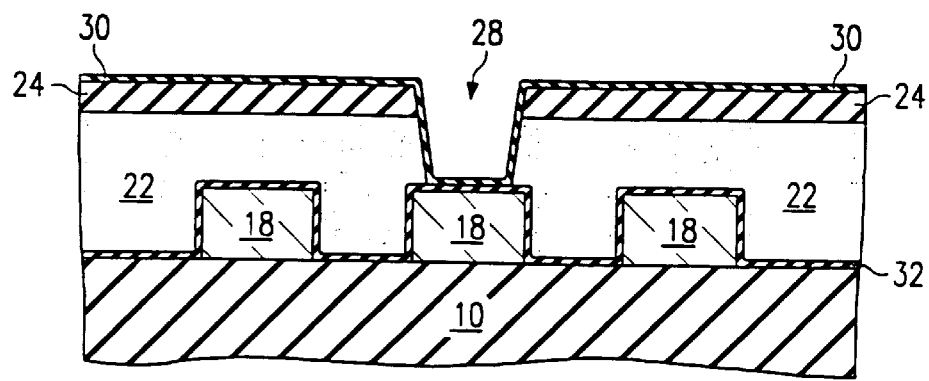
Figure 2C:
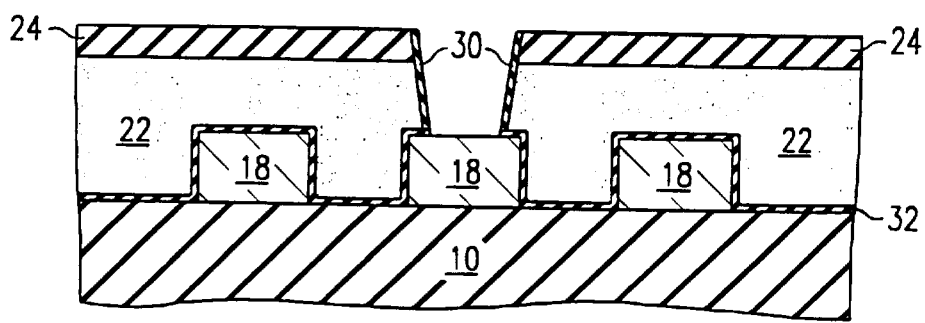

FIGS. 2A–2C show a second embodiment which includes an inorganic substrate encapsulation layer 32 deposited conformally over the patterned conductors 18 and substrate 10. FIG. 2A shows the structure after patterning of the conductors and deposition of encapsulation layer 32. Steps similar to those of the first embodiment are then performed to construct the cross-section of FIG. 2B. This embodiment differs in that the bottom of via 28 is now obstructed by both substrate encapsulation layer 32 and via passivation layer 30. Clearing the bottom of the via utilizes an anisotropic etch which can remove both obstructing layers. Since only via passivation layer 30 exists on top of cap layer 24, the cap layer may be deposited with additional thickness designed to be sacrificial; that is, a portion of the cap layer may be removed during etching of the passivating layers. An additional advantage afforded by this embodiment is that organic-containing layer 22 may be completely enclosed by the passivating and encapsulating material, such that conducting material is completely isolated from organic-containing material.

Figure 3A:
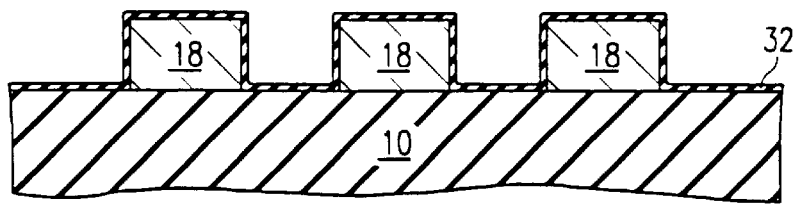
FIGS. 3A–3C are cross-sectional views of another embodiment containing a similar encapsulation layer, but employing a double hard mask technique to clear the bottom of the via.
Figure 3B:
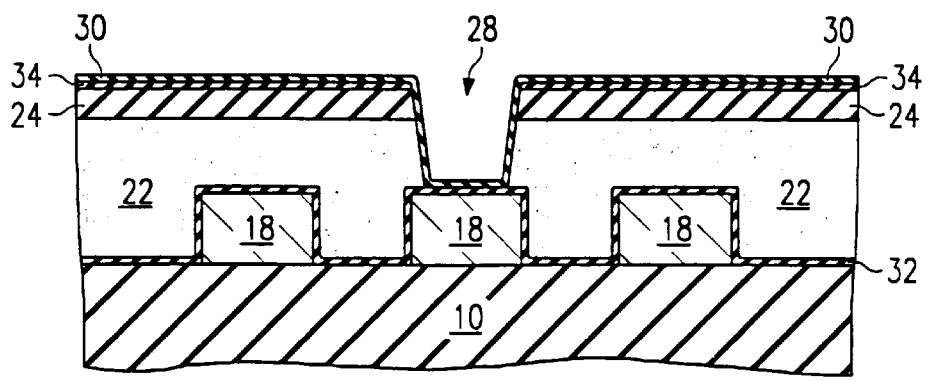
Figure 3C:
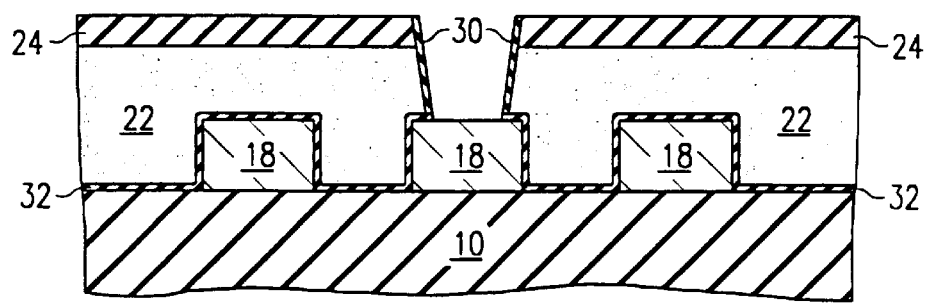

Another method which may be used with a substrate encapsulation layer is depicted in FIGS. 3A–3C. FIG. 3A is identical to FIG. 2A, but FIG. 3B shows a cap layer 24 covered by a hard mask layer 34 which is formed of an inorganic material resistant to the passivation/encapsulation layer etch. One choice may be a silicon nitride hard mask, if for example, passivating layer 30 and encapsulation layer 32 are constructed of primarily silicon dioxide. This embodiment may require an additional etch step during via opening to remove hard mask layer 34 from the via opening. After via etching of hard mask layer 34, cap layer 24, and dielectric layer 22, via passivation layer 30 is formed to directly overlay hard mask layer 34 instead of cap layer 24. The anisotropic etch to clear the bottom of via 28 now will remove passivation layer 30 from at least the top surfaces of hard mask layer 34. The hard mask layer then acts as an etch stop to prevent etching into cap layer 24, although the tops of the passivation layer 30 lining the via sidewalls are not protected from the etch. After the bottom of via 28 is cleared, hard mask 34 may be left in place. As an alternative, the hard mask may be removed by a selective etch to complete the structure of FIG. 3C.

Figure 4:
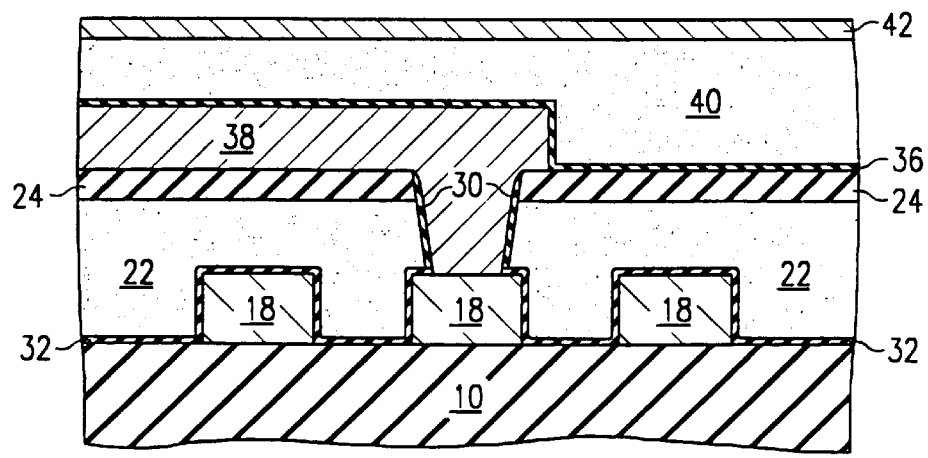
FIG. 4 is a cross-sectional view of a two-level embodiment, wherein a filled via is shown electrically connecting conductors on two conductor layers, with both layers constructed using an organic-containing dielectric with an inorganic cap layer.

FIG. 4 shows a cross-section of an embodiment of the invention which illustrates how the various features and advantages of the invention may be employed on multiple layers of patterned conductors. An intermediate structure similar to that of FIG. 2C is built upon by first adding a second layer of patterned conductors 38 above cap layer 24 and in via 28. This layer may be formed by depositing several sublayers (Ti/TiN/AlCu alloy, for example) of conducting material over the structure and patterning this material in a manner similar to the formation of conductors 18. After patterning of the second conducting layer, a second substrate encapsulation layer 36 is deposited over the exposed surfaces of cap layer 24 and second conductor layer 38, followed by a second organic-containing dielectric layer 40 and a second cap layer 42. If connections to yet another overlying layer of conductors (not shown) is desired, via formation on the second conducting layer may then proceed according to one of the methods of the invention.

The table provides an overview of some embodiments and the drawings.

TABLE

| Drawing Element | Preferred or Specific Examples | Generic Term | Other Alternate Examples |
|---|---|---|---|
| 10 | $SiO_2$ | Substrate | Other oxides, P-glass, silicon nitride, tetraethylorthosilicate (TEOS), cap layer from previous application of invention |

TABLE-continued

| Drawing Element | Preferred or Specific Examples | Generic Term | Other Alternate Examples |
|---|---|---|---|
| 12,18,38 | AlCu alloy with Ti or TiN underlayers | Patterned conductors | Al, Cu, Mo, W, Ti, and alloys of these Polysilicon, silicides, nitrides, carbides |
| 14,26 | | Photoresist | |
| 22,40 | Parylene | Organic-containing dielectric layer | Polymeric SOG such as Allied Signal 500 series, amorphous Teflon, polyimides, other organic polymers |
| 24,42 | Silicon dioxide | Inorganic cap layer | Other oxides, doped $SiO_2$, P-glass Silicon nitride |
| 30 | Silicon dioxide | Inorganic via passivation layer | Other oxides, doped $SiO_2$, P-glass Silicon nitride |
| 32,36 | Silicon dioxide | Inorganic substrate encapsulation layer | Other oxides, doped $SiO_2$, P-glass Silicon nitride |
| 34 | Silicon nitride | Hard mask layer | oxynitrides, other materials resistant to passivation layer etchants |

The invention is not to be construed as limited to the particular examples described herein, as these are to be regarded as illustrative, rather than restrictive. The invention is intended to cover all processes and structures which do not depart from the spirit and scope of the invention. For example, it would be immediately obvious to one skilled in the art that the relative thicknesses of illustrated layers may be changed to enhance stated or other advantages of the present invention. Also, properties of some of the specific examples may be combined without deviating from the nature of the invention.

What is claimed is:

1. A semiconductor device which comprises:
   (a) a layer of patterned conductors formed on a substrate and having an inorganic substrate encapsulation layer deposited conformally over said conductors and said substrate;
   (b) an organic-containing dielectric layer filling spaces between and covering said conductors, said organic-containing layer having a dielectric constant of less than 3.5, said organic-containing layer composed of a material containing 10% to 100% polymer by weight;
   (c) a cap layer comprised of inorganic material deposited over said organic-containing layer;
   (d) at least one via etched through said cap layer, said organic-containing layer; and said inorganic substrate encapsulation layer;
   (e) an inorganic passivating layer deposited on the sidewalls of said via where said via passes through said organic-containing dielectric; and
   (f) an electrical connection formed by filling said via with a conducting material, said electrical connection being connected to one of said patterned conductors, whereby connection can be made to a second level of patterned conductors deposited above the inorganic dielectric layer.

2. The device of claim 1, wherein said organic substrate encapsulation layer, said cap layer, and said inorganic passivating layer are formed of a first inorganic material.

3. The device of claim 2, wherein said first inorganic material is substantially silicon dioxide.

4. The device of claim 1, wherein said cap layer is comprised of at least a top and a bottom sublayer.

5. The device of claim 4, wherein said bottom sublayer is composed of silicon dioxide.

6. The device of claim 4, wherein said top sublayer is composed of silicon nitride.

7. The device of claim 1, further comprising a second level of patterned conductors overlaying said cap layer.

8. The device of claim 7, further comprising a second organic-containing dielectric layer filling spaces between said second level of patterned conductors.

* * * * *